(12) United States Patent
Wang

(10) Patent No.: US 9,761,744 B2
(45) Date of Patent: Sep. 12, 2017

(54) SYSTEM AND METHOD FOR MANUFACTURING PHOTOVOLTAIC STRUCTURES WITH A METAL SEED LAYER

(71) Applicant: SolarCity Corporation, San Mateo, CA (US)

(72) Inventor: Wei Wang, San Jose, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 14/920,776

(22) Filed: Oct. 22, 2015

(65) Prior Publication Data

US 2017/0117423 A1  Apr. 27, 2017

(51) Int. Cl.

| | |
|---|---|
| *H01L 31/18* | (2006.01) |
| *H01L 31/075* | (2012.01) |
| *H01L 31/0224* | (2006.01) |
| *C23C 14/34* | (2006.01) |
| *C25D 17/00* | (2006.01) |
| *C25D 7/12* | (2006.01) |

(Continued)

(52) U.S. Cl.
CPC ...... *H01L 31/022466* (2013.01); *C23C 14/34* (2013.01); *C23C 14/50* (2013.01); *C25D 7/126* (2013.01); *C25D 17/001* (2013.01); *H01L 21/67* (2013.01); *H01L 31/022425* (2013.01); *H01L 31/075* (2013.01); *H01L 31/0747* (2013.01); *H01L 31/18* (2013.01); *H01L 31/1864* (2013.01); *H01L 31/1884* (2013.01)

(58) Field of Classification Search
CPC ............. H01L 31/1896; H01L 31/1864; H01L 31/075; H01L 31/022466; C25D 17/001; C23C 14/34

USPC ........................................................ 136/253
See application file for complete search history.

(56) References Cited

U.S. PATENT DOCUMENTS

| 819,360 A | 3/1902 | Mayer |
|---|---|---|
| 2,626,907 A | 1/1953 | De |

(Continued)

FOREIGN PATENT DOCUMENTS

| CN | 101553933 | 10/2009 |
|---|---|---|
| CN | 100580957 C | 1/2010 |

(Continued)

OTHER PUBLICATIONS

WP Leroy et al., "In Search for the Limits of Rotating Cylindrical Magnetron Sputtering", Magnetron, ION Processing and ARC Technologies European Conference, Jun. 18, 2010, pp. 1-32.

(Continued)

*Primary Examiner* — Caridad Everhart
(74) *Attorney, Agent, or Firm* — Shun Yao; Park, Vaughan, Fleming & Dowler LLP

(57) ABSTRACT

One embodiment of the present invention can provide a system for fabrication of a photovoltaic structure. The system can include a physical vapor deposition tool configured to sequentially deposit a transparent conductive oxide layer and a metallic layer on an emitter layer formed in a first surface of a Si substrate, without requiring the Si substrate to be removed from the physical vapor deposition tool after depositing the transparent conductive oxide layer. The system can further include an electroplating tool configured to plate a metallic grid on the metallic layer and a thermal annealing tool configured to anneal the transparent conductive oxide layer.

20 Claims, 6 Drawing Sheets

(51) Int. Cl.
  *C23C 14/50* (2006.01)
  *H01L 21/67* (2006.01)
  *H01L 31/0747* (2012.01)

(56) References Cited

U.S. PATENT DOCUMENTS

| | | |
|---|---|---|
| 2,938,938 A | 5/1960 | Dickson |
| 3,094,439 A | 6/1963 | Mann |
| 3,116,171 A | 12/1963 | Nielsen |
| 3,459,597 A | 8/1969 | Baron |
| 3,961,997 A | 6/1976 | Chu |
| 3,969,163 A | 7/1976 | Wakefield |
| 4,015,280 A | 3/1977 | Matsushita |
| 4,082,568 A | 4/1978 | Lindmayer |
| 4,124,410 A | 11/1978 | Kotval |
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A | 9/1986 | Hamakawa |
| 4,617,421 A | 10/1986 | Nath |
| 4,633,033 A | 12/1986 | Nath |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington |
| 4,753,683 A | 6/1988 | Ellion |
| 4,771,017 A | 9/1988 | Tobin |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Floedl |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,808,315 A | 9/1998 | Murakami |
| 5,814,195 A | 9/1998 | Lehan |
| 5,903,382 A | 5/1999 | Tench |
| 5,935,345 A | 8/1999 | Kuznicki |
| 6,034,322 A | 3/2000 | Pollard |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,803,513 B2 | 10/2004 | Beernink |
| 6,841,051 B2 | 1/2005 | Crowley |
| 7,030,413 B2 | 4/2006 | Nakamura |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German |
| 7,977,220 B2 | 7/2011 | Sanjurjo |
| 8,070,925 B2 | 12/2011 | Hoffman |
| 8,115,093 B2 | 2/2012 | Gui |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 2001/0008143 A1 | 7/2001 | Sasaoka |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes |
| 2003/0070705 A1 | 4/2003 | Hayden |
| 2003/0097447 A1 | 5/2003 | Johnston |
| 2003/0116185 A1 | 6/2003 | Oswald |
| 2003/0121228 A1 | 7/2003 | Stoehr |
| 2003/0168578 A1 | 9/2003 | Taguchi |
| 2003/0183270 A1 | 10/2003 | Falk |
| 2003/0201007 A1 | 10/2003 | Fraas |
| 2004/0065363 A1 | 4/2004 | Fetzer |
| 2004/0103937 A1 | 6/2004 | Bilyalov |
| 2004/0112426 A1 | 6/2004 | Hagino |
| 2004/0123897 A1 | 7/2004 | Ojima |
| 2004/0135979 A1 | 7/2004 | Hazelton |

(56) References Cited

U.S. PATENT DOCUMENTS

| | | |
|---|---|---|
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira |
| 2005/0022861 A1 | 2/2005 | Rose |
| 2005/0061665 A1 | 3/2005 | Pavani |
| 2005/0064247 A1 | 3/2005 | Sane |
| 2005/0074954 A1 | 4/2005 | Yamanaka |
| 2005/0109388 A1 | 5/2005 | Murakami |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |
| 2005/0257823 A1 | 11/2005 | Zwanenburg |
| 2006/0012000 A1 | 1/2006 | Estes |
| 2006/0060238 A1 | 3/2006 | Hacke |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0260673 A1 | 11/2006 | Takeyama |
| 2006/0272698 A1 | 12/2006 | Durvasula |
| 2006/0283496 A1 | 12/2006 | Okamoto |
| 2006/0283499 A1 | 12/2006 | Terakawa |
| 2007/0023081 A1 | 2/2007 | Johnson |
| 2007/0023082 A1 | 2/2007 | Manivannan |
| 2007/0108437 A1 | 5/2007 | Tavkhelidze |
| 2007/0110975 A1 | 5/2007 | Schneweis |
| 2007/0132034 A1 | 6/2007 | Curello |
| 2007/0137699 A1 | 6/2007 | Manivannan |
| 2007/0148336 A1 | 6/2007 | Bachrach |
| 2007/0186968 A1 | 8/2007 | Nakauchi |
| 2007/0186970 A1 | 8/2007 | Takahashi |
| 2007/0202029 A1 | 8/2007 | Burns |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann |
| 2007/0283997 A1 | 12/2007 | Hachtmann |
| 2008/0000522 A1 | 1/2008 | Johnson |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar |
| 2008/0053519 A1 | 3/2008 | Pearce |
| 2008/0061293 A1 | 3/2008 | Ribeyron |
| 2008/0092947 A1 | 4/2008 | Lopatin |
| 2008/0121272 A1 | 5/2008 | Besser |
| 2008/0121276 A1 | 5/2008 | Lopatin |
| 2008/0121932 A1 | 5/2008 | Ranade |
| 2008/0128013 A1* | 6/2008 | Lopatin ............... C25D 5/022 |
| | | 136/244 |
| 2008/0149161 A1 | 6/2008 | Nishida |
| 2008/0156370 A1 | 7/2008 | Abdallah |
| 2008/0173347 A1 | 7/2008 | Korevaar |
| 2008/0173350 A1 | 7/2008 | Choi |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness |
| 2008/0230122 A1 | 9/2008 | Terakawa |
| 2008/0251114 A1 | 10/2008 | Tanaka |
| 2008/0251117 A1 | 10/2008 | Schubert |
| 2008/0264477 A1 | 10/2008 | Moslehi |
| 2008/0276983 A1 | 11/2008 | Drake |
| 2008/0283115 A1 | 11/2008 | Fukawa |
| 2008/0302030 A1 | 12/2008 | Stancel |
| 2008/0303503 A1 | 12/2008 | Wolfs |
| 2008/0308145 A1 | 12/2008 | Krasnov |
| 2009/0007965 A1 | 1/2009 | Rohatgi |
| 2009/0056805 A1 | 3/2009 | Barnett |
| 2009/0078318 A1 | 3/2009 | Meyers |
| 2009/0084439 A1 | 4/2009 | Lu |
| 2009/0101872 A1 | 4/2009 | Young |
| 2009/0139512 A1 | 6/2009 | Lima |
| 2009/0151783 A1 | 6/2009 | Lu |
| 2009/0155028 A1 | 6/2009 | Boguslavskiy |
| 2009/0160259 A1 | 6/2009 | Naiknaware et al. |
| 2009/0188561 A1 | 7/2009 | Aiken |
| 2009/0221111 A1 | 9/2009 | Frolov |
| 2009/0229854 A1 | 9/2009 | Fredenberg |
| 2009/0239331 A1 | 9/2009 | Xu |
| 2009/0250108 A1 | 10/2009 | Zhou |
| 2009/0255574 A1 | 10/2009 | Yu |
| 2009/0283138 A1 | 11/2009 | Lin |
| 2009/0283145 A1 | 11/2009 | Kim |
| 2009/0293948 A1 | 12/2009 | Tucci |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman |
| 2010/0043863 A1 | 2/2010 | Wudu |
| 2010/0065111 A1 | 3/2010 | Fu |
| 2010/0068890 A1 | 3/2010 | Stockum |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu |
| 2010/0132774 A1 | 6/2010 | Borden |
| 2010/0132792 A1 | 6/2010 | Kim |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0229914 A1 | 9/2010 | Adriani |
| 2010/0236612 A1 | 9/2010 | Khajehoddin |
| 2010/0240172 A1 | 9/2010 | Rana |
| 2010/0269904 A1 | 10/2010 | Cousins |
| 2010/0279492 A1 | 11/2010 | Yang |
| 2010/0300506 A1 | 12/2010 | Heng |
| 2010/0300507 A1 | 12/2010 | Heng |
| 2010/0307592 A1* | 12/2010 | Chang ............... C23C 14/086 |
| | | 136/263 |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1* | 1/2011 | Ivanov ............... C23C 14/0641 |
| | | 204/192.13 |
| 2011/0073175 A1* | 3/2011 | Hilali ............... H01L 31/022441 |
| | | 136/256 |
| 2011/0088762 A1* | 4/2011 | Singh ............... H01L 31/03921 |
| | | 136/255 |
| 2011/0146759 A1 | 6/2011 | Lee |
| 2011/0146781 A1 | 6/2011 | Laudisio |
| 2011/0156188 A1 | 6/2011 | Tu |
| 2011/0168250 A1 | 7/2011 | Lin |
| 2011/0168261 A1 | 7/2011 | Welser |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch |
| 2011/0308573 A1 | 12/2011 | Jaus |
| 2012/0000502 A1 | 1/2012 | Wiedeman |
| 2012/0012174 A1 | 1/2012 | Wu |
| 2012/0028461 A1 | 2/2012 | Ritchie |
| 2012/0031480 A1 | 2/2012 | Tisler |
| 2012/0040487 A1 | 2/2012 | Asthana |

(56) References Cited

U.S. PATENT DOCUMENTS

| | | |
|---|---|---|
| 2012/0073975 A1 | 3/2012 | Ganti |
| 2012/0080083 A1 | 4/2012 | Liang |
| 2012/0085384 A1 | 4/2012 | Beitel |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0167986 A1 | 7/2012 | Meakin |
| 2012/0192932 A1 | 8/2012 | Wu |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu |
| 2012/0318319 A1 | 12/2012 | Pinarbasi |
| 2012/0318340 A1 | 12/2012 | Heng |
| 2012/0325282 A1 | 12/2012 | Snow |
| 2013/0000705 A1 | 1/2013 | Shappir |
| 2013/0014802 A1 | 1/2013 | Zimmerman |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1* | 5/2013 | Moslehi ............ H01L 31/1864 438/89 |
| 2013/0139878 A1* | 6/2013 | Bhatnagar ....... H01L 31/022466 136/256 |
| 2013/0152996 A1 | 6/2013 | DeGroot |
| 2013/0160826 A1 | 6/2013 | Beckerman |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0124013 A1 | 5/2014 | Morad |
| 2014/0124014 A1 | 5/2014 | Morad |
| 2014/0154836 A1 | 6/2014 | Kim |
| 2014/0196768 A1 | 7/2014 | Heng |
| 2014/0242746 A1* | 8/2014 | Albadri ........... H01L 31/022475 438/94 |
| 2014/0318611 A1 | 10/2014 | Moslehi |
| 2014/0345674 A1 | 11/2014 | Yang |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0171230 A1 | 6/2015 | Kapur |
| 2015/0214409 A1 | 7/2015 | Pfeiffer |
| 2015/0270410 A1 | 9/2015 | Heng |
| 2015/0280641 A1 | 10/2015 | Garg |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0190354 A1* | 6/2016 | Agrawal ............ H01L 31/0747 136/256 |

FOREIGN PATENT DOCUMENTS

| | | |
|---|---|---|
| CN | 102263157 | 11/2011 |
| CN | 104409402 | 3/2015 |
| DE | 4030713 | 4/1992 |
| DE | 102006009194 | 8/2007 |
| DE | 202007002897 | 8/2008 |
| DE | 102010061317 | 6/2012 |
| DE | 10201201051 | 11/2013 |
| DE | 102012010151 | 11/2013 |
| EP | 1770791 | 4/2007 |
| EP | 1816684 | 8/2007 |
| EP | 2071635 | 6/2009 |
| EP | 2113946 | 11/2009 |
| EP | 2362430 | 8/2011 |
| EP | 2385561 A2 | 11/2011 |
| EP | 2479796 A1 | 7/2012 |
| EP | 2626907 A1 | 8/2013 |
| EP | 2479796 | 7/2015 |
| EP | 2626907 | 8/2015 |
| JP | H04245683 A | 9/1992 |
| JP | H07249788 A | 9/1995 |
| JP | 10004204 | 1/1998 |
| JP | H1131834 | 2/1999 |
| JP | 2000164902 | 6/2000 |
| JP | 2002057357 A | 2/2002 |
| JP | 2005159312 A | 6/2005 |
| JP | 2006324504 | 11/2006 |
| JP | 2008135655 | 6/2008 |
| JP | 2009054748 | 3/2009 |
| JP | 2009177225 | 8/2009 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 20050122721 A | 12/2005 |
| KR | 20060003277 A | 1/2006 |
| KR | 20090011519 A | 2/2009 |
| WO | 9117839 | 11/1991 |
| WO | 9120097 A1 | 12/1991 |
| WO | 03083953 A1 | 10/2003 |
| WO | 2006097189 A1 | 9/2006 |
| WO | 2008089657 | 7/2008 |
| WO | 2009094578 | 7/2009 |
| WO | 2009150654 | 12/2009 |
| WO | 2009150654 A2 | 12/2009 |
| WO | 2010070015 | 6/2010 |
| WO | 2010075606 | 7/2010 |
| WO | 2010075606 A1 | 7/2010 |
| WO | 2010085949 | 8/2010 |
| WO | 2010104726 A2 | 9/2010 |
| WO | 2010123974 | 10/2010 |
| WO | 2010123974 A1 | 10/2010 |
| WO | 2011005447 | 1/2011 |
| WO | 2011005447 A2 | 1/2011 |
| WO | 2011008881 | 1/2011 |
| WO | 2011008881 A2 | 1/2011 |
| WO | 2011053006 | 5/2011 |
| WO | 2011123646 A2 | 10/2011 |
| WO | 2013020590 | 2/2013 |
| WO | 2013020590 A1 | 2/2013 |
| WO | 2013046351 | 4/2013 |
| WO | 2014074826 | 5/2014 |
| WO | 2014110520 | 7/2014 |
| WO | 2014117138 | 7/2014 |

(56) References Cited

FOREIGN PATENT DOCUMENTS

WO    2015183827    12/2015
WO    2016090332    6/2016

OTHER PUBLICATIONS

Beaucarne G et al: 'Epitaxial thin-film Si solar cells' Thin Solid Films, Elsevier-Sequoia S.A. Lausanne, CH LNKD- DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].
Chabal, Yves J. et al., 'Silicon Surface and Interface Issues for Nanoelectronics,' The Electrochemical Society Interface, Spring 2005, pp. 31-33.
Collins English Dictionary (Convex. (2000). In Collins English Dictionary. http://search.credoreference.com/content/entry/hcengdict/convex/0 on Oct. 18, 2014).
Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20I.pptx> and converted to PDF.
Davies, P.C.W., 'Quantum tunneling time,' Am. J. Phys. 73, Jan. 2005, pp. 23-27.
Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.
Green, Martin A. et al., 'High-Efficiency Silicon Solar Cells,' IEEE Transactions on Electron Devices, vol. ED-31, No. 5, May 1984, pp. 679-683.
Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.
JCS Pires, J Otubo, AFB Braga, PR Mei; The purification of metallurgical grade silicon by electron beam melting, J of Mats Process Tech 169 (2005) 16-20.
Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.
Merriam-Webster online dictionary—"mesh". (accessed Oct. 8, 2012).
Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.
Mueller, Thomas, et al. "High quality passivation for heterojunction solar cells by hydrogenated amorphous silicon suboxide films." Applied Physics Letters 92.3 (2008): 033504-033504.
Munzer, K.A. "High Throughput Industrial In-Line Boron BSF Diffusion" Jun. 2005. 20th European Photovoltaic Solar Energy Conference, pp. 777-780.

National Weather Service Weather Forecast Office ("Why Do We have Seasons?" http://www.crh.noaa.gov/lmk/?n=seasons Accessed Oct. 18, 2014).
O'Mara, W.C.; Herring, R.B.; Hunt L.P. (1990). Handbook of Semiconductor Silicon Technology. William Andrew Publishing/Noyes. pp. 275-293.
Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.
Stangl et al., Amorphous/Crystalline Silicon heterojunction solar cells—a simulation study; 17th European Photovoltaic Conference, Munich, Oct. 2001.
Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.
Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.
Parthavi, "Doping by Diffusion and Implantation", <http://www.leb.eei.uni-erlangen.de/winterakademie/2010/report/course03/pdf/0306.pdf>.
Weiss, "Development of different copper seed layers with respect to the copper electroplating process," Microelectronic Engineering 50 (2000) 443-440, Mar. 15, 2000.
Tomasi, "Back-contacted Silicon Heterojunction Solar Cells With Efficiency>21%" 2014 IEEE.
Hornbachner et al., "Cambered Photovoltaic Module and Method for its Manufacture" Jun. 17, 2009.
Machine translation of JP 10004204 A, Shindou et al.
Jianhua Zhao et al. "24% Efficient pert silicon solar cell: Recent improvements in high efficiency silicon cell research".
"Nonequilibrium boron doping effects in low-temperature epitaxial silicon" Meyerson et al., Appl. Phys. Lett. 50 (2), p. 113 (1987).
"Doping Diffusion and Implantation" Parthavi, <http://www.leb.eei.uni-erlangen.de/winterakademie/2010/report/content/course03/pdf/0306.pdf>.
Kanani, Nasser. Electroplating: Basic Principles, Processes and Practice, Chapter 8—"Coating Thickness and its Measurement," 2004, pp. 247-291.
P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.
L. Korte et al. "Overview on a-Se:H/c heterojunction solar cells— physics and technology", Proceedings of the 22nd European Photovoltaic Solar Energy Conference, Sep. 3, 2007-Sep. 7, 2007, pp. 859-865.

* cited by examiner

SYSTEM AND METHOD FOR MANUFACTURING PHOTOVOLTAIC STRUCTURES WITH A METAL SEED LAYER

CROSS-REFERENCE TO OTHER APPLICATION

This is related to U.S. patent application Ser. No. 13/220,532, entitled "SOLAR CELL WITH ELECTROPLATED METAL GRID," filed Aug. 29, 2011, the disclosure of which is incorporated herein by reference in its entirety for all purposes.

FIELD OF THE INVENTION

This generally relates to the fabrication of photovoltaic structures. More specifically, this is related to the fabrication of photovoltaic structures having a metal seed layer.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A photovoltaic structure may be divided into a number of strips. A strip may have any shape and any size. The width and length of a strip may be the same or different from each other. Strips may be formed by further dividing a previously divided strip.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

BACKGROUND

Most of the current solar cell manufacturing facilities, however, are insufficiently equipped and/or not optimized for large-scale production. The emerging solar market demands factories that can produce hundreds of megawatts, if not gigawatts, of solar cells per year. The design, size, and throughput of present facilities are not intended for such high-volume manufacturing. Hence, various new designs in the manufacturing process are needed.

SUMMARY

One embodiment of the present invention can provide a system for fabrication of a photovoltaic structure. The system can include a physical vapor deposition tool configured to sequentially deposit a transparent conductive oxide layer and a metallic layer on an emitter layer formed on a first surface of a Si substrate, without requiring the Si substrate to be removed from the physical vapor deposition tool after depositing the transparent conductive oxide layer. The system can further include an electroplating tool configured to plate a metallic grid on the metallic layer and a thermal annealing tool configured to anneal the transparent conductive oxide layer.

In a variation of this embodiment, the thermal annealing tool can be configured to subject the photovoltaic structure to a temperature ranging from 150° C. to 400° C.

In a further variation, the thermal annealing tool can be configured to subject the photovoltaic structure to the temperature for a time period ranging from 5 seconds to 5 minutes.

In a further variation, the thermal annealing tool can be configured to anneal the transparent conducing oxide layer in air, vacuum, forming gas, or inert gases.

In a variation of this embodiment, the electroplating tool can be configured to plate a metallic grid before the thermal annealing tool annealing the transparent conductive oxide layer, and the thermal annealing tool can be configured to simultaneously anneal the plated metallic grid and the transparent conductive oxide layer.

In a variation of this embodiment, the physical vapor deposition tool can be further configured to sequentially deposit a second transparent conductive oxide layer and a second metallic layer on a surface-field layer formed on a second surface of the Si substrate, without requiring the Si substrate to be removed from the physical vapor deposition tool after depositing the second transparent conductive oxide layer. The electroplating tool can be further configured to deposit a second metallic grid on the second metallic seed layer.

In a variation of this embodiment, the physical vapor deposition tool can be configured to perform sputtering, evaporation, or both.

In a variation of this embodiment, the metallic thin layer can include: Cu, Ni, Ag, Ti, Ta, W, TiN, TaN, WN, TiW, NiCr, or any combination thereof.

In a variation of this embodiment, the transparent conductive oxide layer can include: indium-tin-oxide (ITO), aluminum-doped zinc-oxide (ZnO:Al), gallium-doped zinc-oxide (ZnO:Ga), tungsten-doped indium oxide (IWO), Zn—in—Sn—O (ZITO), or any combination thereof.

In a variation of this embodiment, the physical vapor deposition tool can be configured to deposit the transparent conductive oxide layer at a temperature lower than 100° C.

DETAILED DESCRIPTION

Figure 1:
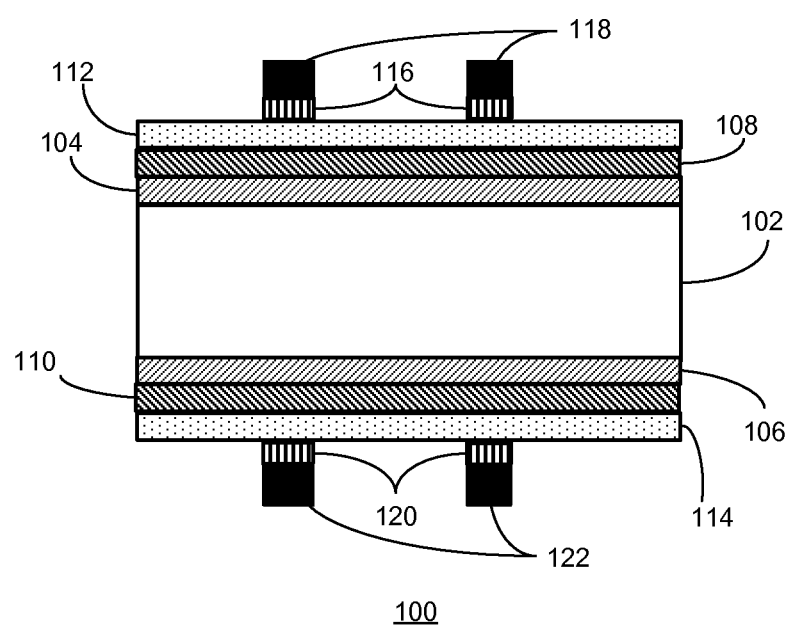
FIG. 1 shows an exemplary photovoltaic structure, according to an embodiment of the present invention.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention can solve the technical problem of improving the production throughput for photovoltaic structures with electroplated metallic grids. The photovoltaic structures can include a metallic seed layer formed using a physical vapor deposition (PVD) process to improve adhesion between an electroplated metallic grid and a TCO layer. Typically, a conventional fabrication process involves post-deposition annealing of the TCO layer. For photovoltaic structures with a metallic seed layer on the TCO layer, the annealing is usually performed before depositing the metallic seed layer, and often involves removing the photovoltaic structures from the deposition chamber. In some embodiments of the present invention, the metallic seed layer can be deposited after the deposition of the TCO layer and before the TCO annealing. This arrangement allows the TCO layer and the metallic seed layer to be deposited in the same chamber. The consolidation of these two operations can streamline the fabrication of photovoltaic structures, which can then increase the production throughput. Subsequently, a high-temperature, rapid annealing process can be performed after the deposition of the metallic seed layer or after electrochemical plating (ECP) of the bulk metallic grid to improve the film quality of the TCO layer.

Photovoltaic Structures with Electroplated Metallic Grids

Electroplated metallic electrode grids (e.g., electroplated Cu grids) have been shown to exhibit lower resistance than conventional aluminum or screen-printed-silver-paste electrodes. Such low electrical resistance can be essential in achieving high-efficiency photovoltaic structures. In addition, electroplated copper electrodes can also tolerate micro cracks better, which may occur during a subsequent cleaving process. Such micro cracks might impair silver-paste-electrode cells. Plated-copper electrode, on the other hand, can preserve the conductivity across the cell surface even if there are micro cracks. The copper electrode's higher tolerance for micro cracks allows the use of thinner silicon wafers, which can reduce the overall fabrication cost. More details on using copper plating to form low-resistance electrodes on a photovoltaic structure are provided in U.S. patent application Ser. No. 13/220,532, entitled "SOLAR CELL WITH ELECTROPLATED GRID," filed on Aug. 29, 2011, the disclosure of which is incorporated herein by reference in its entirety.

FIG. 1 shows an exemplary photovoltaic structure, according to an embodiment of the present invention. In FIG. 1, photovoltaic structure 100 can include base layer 102, front and back quantum tunneling barrier (QTB) layers 104 and 106, emitter layer 108, surface-field layer 110, front and back TCO layers 112 and 114, a front electrode grid that can include Cu seed layer 116 and electroplated bulk Cu layer 118, and a back electrode grid that can include Cu seed layer 120 and electroplated bulk Cu layer 122.

Base layer 102 can include various materials, such as undoped or lightly doped monocrystalline silicon and undoped or lightly doped micro-crystalline silicon. QTB layers 104 and 106 can include various dielectric materials, such as silicon oxide ($SiO_x$), hydrogenated $SiO_x$, silicon nitride ($SiN_x$), hydrogenated $SiN_x$, aluminum oxide ($AlO_x$), silicon oxynitride (SiON), aluminum oxide ($AlO_x$), hydrogenated SiON, and any combination thereof. In addition to dielectric material, the QTB layers may also include intrinsic (e.g., undoped) silicon in various forms, such as single crystalline Si, polycrystalline Si, amorphous Si, and any combination thereof. The QTB layers can be formed using a wet process that may involve wet or steam oxidation. Emitter layer 108 can include heavily doped wide bandgap material, such as amorphous Si (a-Si) or hydrogenated a-Si (a-Si:H). If base layer 102 is lightly doped, emitter layer 108 can have a conductive doping type opposite to that of base layer 102. Surface-field layer 110 can also include heavily doped wide bandgap material, such as a-Si or a-Si:H. The conductive doping type of surface-field layer 110 can be opposite to that of emitter layer 108. In some embodiments, emitter layer 108 and/or surface-field layer 110 can have a graded doping profile, with a lower doping concentration near the base/emitter or base/surface-field layer interface. The formation of emitter layer 108 and/or surface-field layer 110 can involve a chemical-vapor-deposition (CVD) epitaxial process, such as a plasma-enhanced chemical-vapor-deposition (PECVD) process.

Front and back TCO layers 112 and 114 can be formed using materials such as indium-tin-oxide (ITO), aluminum-doped zinc-oxide (ZnO:Al), gallium-doped zinc-oxide (ZnO:Ga), tungsten-doped indium oxide (IWO), Zn—in—Sn—O (ZITO), and their combinations. The TCO layers can be formed using a PVD process. The TCO layers can then be annealed to improve their electro-optical properties (e.g., high transparency over a wide wavelength range and low electrical resistivity). For example, if the TCO layers include ITO, the annealing can reduce its sheet resistance. Typically, the annealing process can include subjecting the photovoltaic structure to an elevated temperature for a period of time. For example, the annealing of an ITO film can involve subjecting the photovoltaic structure to 200° C. for 20 minutes or longer.

As discussed in the aforementioned U.S. patent application Ser. No. 13/220,532, a thin metallic seed layer (e.g., Cu seed layer 116) can be deposited to improve the adhesion between the electroplated Cu grid and the underlying TCO layer using a PVD technique (e.g., sputtering or evaporation), on top of the TCO layer, because high-energy atoms sputtered from the target can adhere well to the TCO layer. This metallic seed layer can then enhance the adhesion between the TCO layer and the subsequently plated Cu grid.

As discussed previously, electroplated Cu grids can provide a number of advantages, such as reduced resistance and increased tolerance to micro cracks. However, the fabrication of a reliable Cu grid can involve depositing a Cu seed layer using a PVD process, which can complicate the fabrication process of photovoltaic structures with Cu grids.

Figure 2:
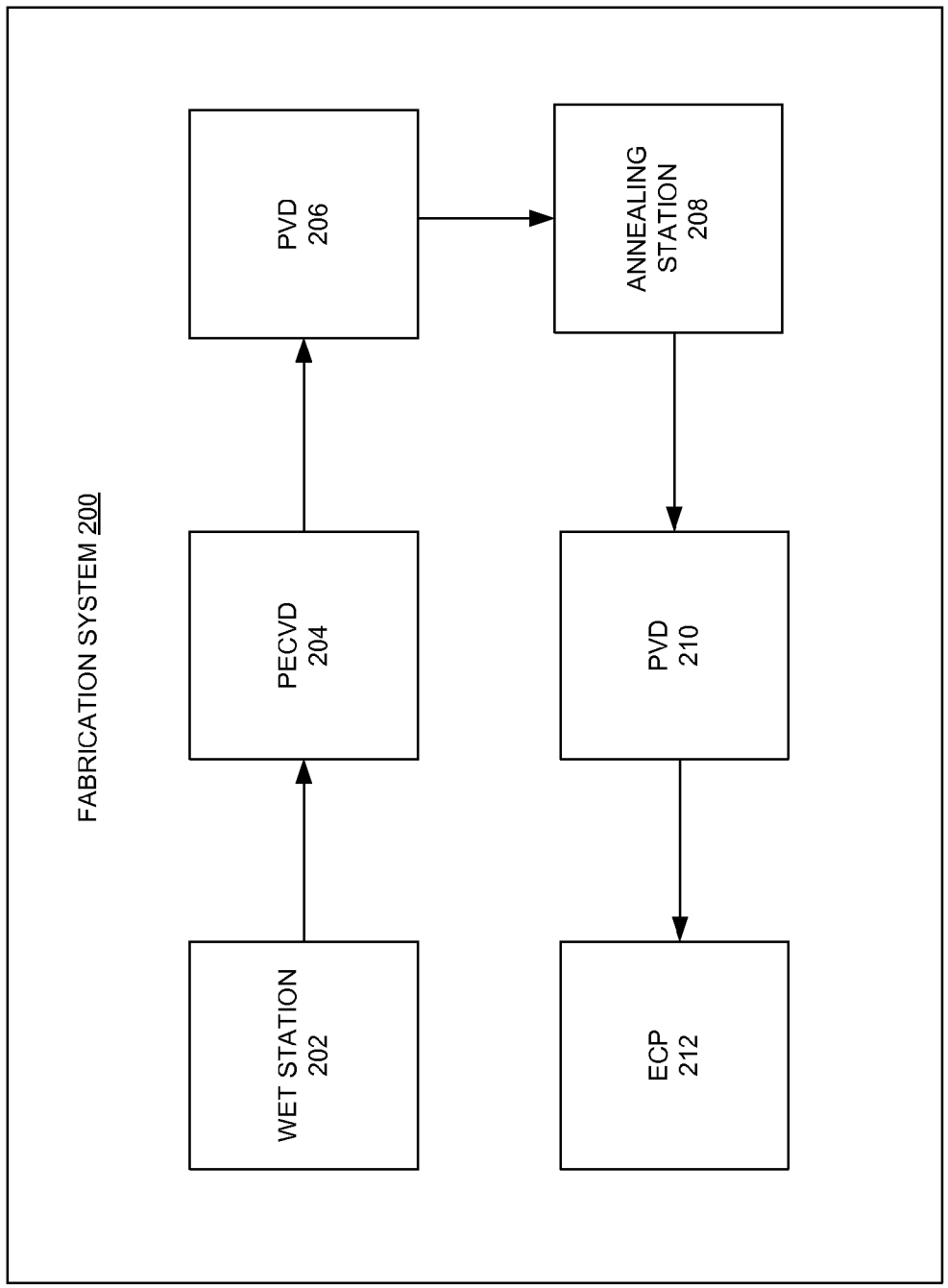
FIG. 2 shows an exemplary fabrication system, according to an embodiment of the present invention.

FIG. 2 shows an exemplary fabrication system of photovoltaic structures, according to an embodiment of the present invention. In FIG. 2, fabrication system 200 can include wet station 202, PECVD tool 204, PVD tool 206, annealing station 208, PVD tool 210, and electrochemical plating (ECP) tool 212.

During fabrication, the substrates (e.g., crystalline Si wafers) can first undergo a series of wet processes (e.g., surface cleaning and texturing, and wet oxidization) at wet station 202, and then be loaded into PECVD tool 204 for the deposition of the emitter and/or surface-field layers. Subsequently, they can be loaded into PVD tool 206 for the deposition of the front and/or back side TCO layer(s). In this approach, the TCO annealing typically occurs right after the TCO deposition, which often requires taking the photovoltaic structures out of the PVD chamber. This is because the PVD process and the TCO annealing process may require different temperatures. For example, radio-frequency (RF) sputtering of an ITO film can be performed at room temperature (e.g., between 20 and 25° C.), whereas typical annealing of the ITO film may require a temperature of at least 150° C. In a production line, it might not be efficient to adjust the temperature setting of a processing tool between batches, because it can take a long time for the ambient temperature inside the processing tool to reach the desired setting. Hence, after the deposition of the TCO layer(s), the photovoltaic structures can be removed from PVD tool 206 and transferred to annealing station 208. After the TCO layer(s) are annealed, the photovoltaic structures can be sent to PVD tool 210, which can be different from PVD tool 206, for the deposition of the metallic seed layer. It is also possible to send the photovoltaic structures back to PVD tool 206 for metal deposition. This approach, however, will increase the product's wait time or the equipment's idle time. Subsequent to the deposition of the metallic seed layer, the photovoltaic structures can be transferred to ECP station 212 for Cu plating. ECP station 212 can include a large electrolyte bath and a moving cathode. Photovoltaic structures attached to the moving cathode can be plated with metal as they move through the electrolyte bath.

Large-scale fabrication may need each processing tool to process tens, sometimes even hundreds, of wafers during each processing cycle. Various deposition tools, such as PECVD tool and PVD tool, can be expensive and have large footprints. The fabrication system shown in FIG. 2 can often include two separate PVD tools for the deposition of the TCO layer and the metallic seed layer. Such a system can be costly and have a large footprint. Moreover, loading and unloading the photovoltaic structures in and out of multiple processing tools can be time-consuming and can lead to wafer damage, thus reducing the overall system throughput.

To solve such a problem, in some embodiments, annealing of the TCO layer can be performed after the deposition of the metallic seed layer or ECP of the metallic grids. The two PVD processes can be performed back-to-back, making it possible to use a single PVD tool to deposit both the TCO layer(s) and the metallic seed layers.

Figure 3:
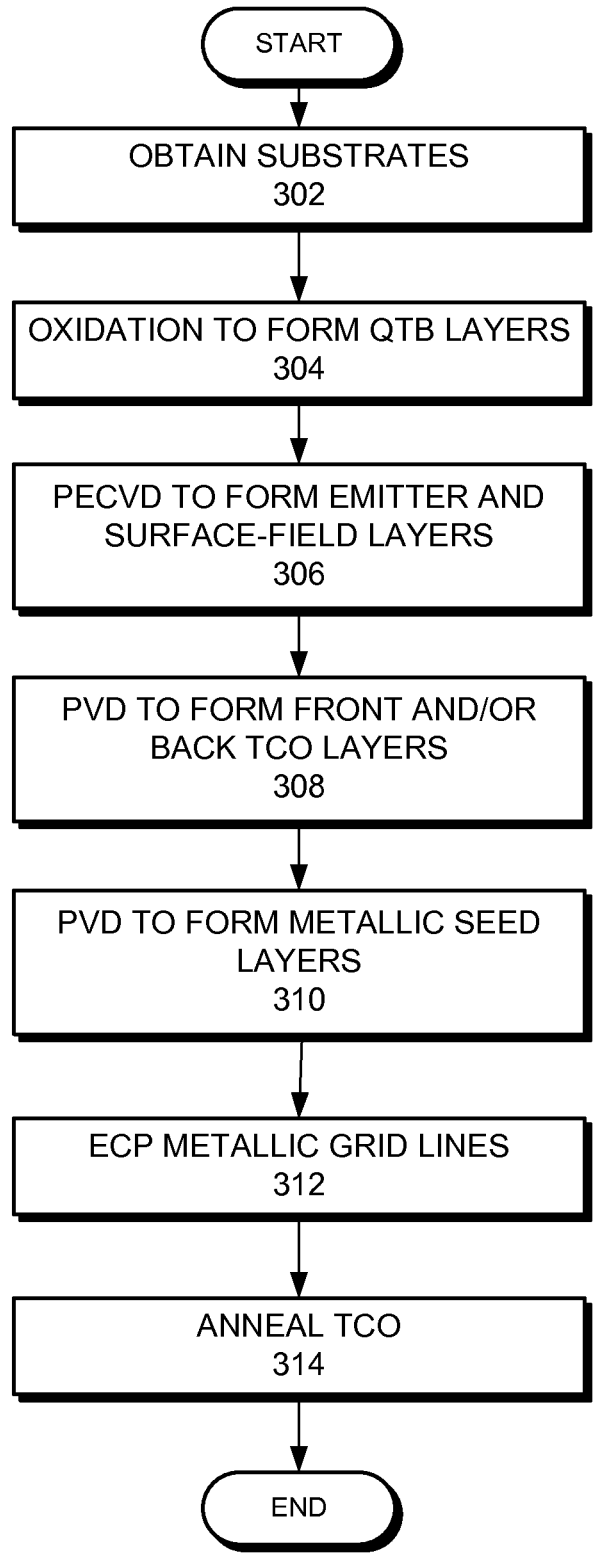
FIG. 3 shows an exemplary fabrication process, according to an embodiment of the present invention.

FIG. 3 shows an exemplary fabrication process, according to an embodiment of the present invention. During fabrication, a plurality of substrates can be obtained (operation 302). The substrates can include crystalline silicon (e.g., monocrystalline silicon or polycrystalline silicon) wafers and can be optionally texturized. The substrates can also be cleaned. In addition, saw damages can be removed via wet etching. The substrates can then be oxidized (e.g., steam or wet oxidation) to form the front and/or back QTB layers (operation 304).

After the wet processes, the substrates can be dried and sent to the PECVD tool for deposition of the emitter layer and surface-field layer (operation 306). For large-scale, high-throughput fabrication, the PECVD tool may simultaneously deposit material onto a large number of substrates at a time. In some embodiments, a wafer carrier that can carry over 100 Si wafers (e.g., 5-inch or 6-inch square or pseudo-square Si wafers) can be used inside the PECVD tool to allow simultaneous material deposition. The wafer carrier can be a graphite or carbon fiber composite (CFC) carrier coated with a low-porosity material, such as pyrolytic carbon or silicon carbide. The wafer carrier may also include a non-flat surface or a partially carved-out structure at the bottom of the wafer-holding pockets. After deposition of the emitter layer, the wafers may be turned over for deposition of a surface-field layer. Alternatively, the deposition sequence may change so that the surface-field layer can be deposited first.

After the PECVD operation(s), the multilayer structures can be sent to a PVD tool for deposition of front and/or back TCO layers (e.g., ITO films) (operation 308). The back TCO layer can facilitate the bifacial operation of the photovoltaic structures. Alternatively, only the front (e.g., the side that faces incident light) TCO layer might be needed.

In some embodiments, the PVD tool can include a sputtering machine, such as a radio-frequency (RF) magnetron sputtering machine. In further embodiments, the RF magnetron sputtering machine can include one or more rotary targets coupled to a periodically tuned capacitor. This arrangement can ensure a uniform etching profile of the targets, which can reduce cost and time for maintenance. A detailed description of the rotary targets can be found in U.S. patent application Ser. No. 14/142,605, entitled "Radio-Frequency Sputtering System with Rotary Target for Fabricating Solar Cells," filed Dec. 27, 2013, the disclosure of which is incorporated herein by reference in its entirety.

In some embodiments, deposition of the front and/or back TCO layers can be performed under a relatively low temperature (e.g., at room temperature or at a temperature lower than 100° C.) in order to improve the open circuit voltage ($V_{oc}$) of the photovoltaic structures. For example, low-temperature PVD can increase the $V_{oc}$ of double-sided heterojunction photovoltaic structures from 710 mV to 720 mV. In addition to improved $V_{oc}$, room temperature PVD can also improve the system throughput, because there is no longer a need to raise the temperature of the PVD tool. TCO films (e.g., ITO films) formed using low-temperature PVD can be in an amorphous structure state. Annealing can crystallize the amorphous TCO to reduce resistivity and improve transparency.

After PVD of the front and/or back TCO layers, the multilayer structures can remain in the same PVD tool for deposition of the metallic seed layers (e.g., Cu seed layers) on the front and back side of the multilayer structures (operation 310). To do so, in some embodiments, the sputtering tool can include multiple targets (e.g., an ITO target and one or more metallic targets) to enable sequential deposition of multiple layers of thin films. For example, the sputtering tool can sequentially deposit an ITO layer and a Cu seed layer. Moreover, the sputtering tool may also deposit one or more metallic adhesive layers between the ITO layer and seed layer. These adhesive layers can improve the adhesion between any subsequently deposited metallic layer and the ITO layer. The metallic seed layers typically can include the same metallic material as the subsequently plated metallic grids, whereas the metallic adhesive layers can include Cu, Ni, Ag, Ti, Ta, W, TiN, TaN, WN, TiW, NiCr, and their combinations. In some embodiments, the multiple targets can be electrically insulated from each other, and can be sequentially biased to allow one active target at a time. Alternatively, the PVD tool can include a rotational shutter to expose only one target to the deposition surface at a time. Other types of sputtering tool (e.g., a sputtering tool with multiple chambers) can also be possible, as long as they allow sequential deposition of multiple layers. In some embodiments, the sputtering tool can be configured to deposit thin films of different materials without breaking the vacuum. For example, the sputtering tool can first deposit a thin layer of ITO and then deposit a thin layer of Cu under the same vacuum, thus significantly reducing the processing time.

In some embodiments, subsequent to PVD deposition of the multiple layers (e.g., a TCO layer and a metallic seed layer), the multilayer structures can be taken out of the PVD tool and sent to the ECP station for the plating of the front and back side metallic grids (operation 312). The photolithography process that defines the grid pattern can be a standard process and is not shown in the flowchart. ECP of the metallic grids can include electroplating of a Cu grid on both the front and back sides of the multilayer structures.

After ECP, the multilayer structures with metallic grids can be sent to the annealing station for annealing of the TCO layers and/or ECP metallic grids (operation 314). As discussed previously, annealing is important to TCO because it can improve the optical and electrical properties of the TCO material. However, because the multilayer structures now include metallic grids with thin lines (e.g., front and back Cu grids with thin Cu finger lines), the conventional annealing process may not be suitable. For example, a typical TCO annealing process may involve subjecting the TCO-coated multilayer structures to a temperature of 200° C. for 20 minutes or longer. Exposing the metallic grids to a high temperature for a prolonged period may weaken the thin metal lines, especially the bonding between the thin metal lines and the underlying structure. To prevent peeling-off of the thin metal lines, in some embodiments, the annealing of the TCO can include a high-temperature, rapid annealing process. More specifically, the annealing temperature can be between 150° C. and 400° C., and the time duration can be between a few seconds (e.g., 5 seconds) and a few minutes (e.g., 5 minutes). Because the metallic grids are only exposed to the high temperature environment for a short time period, minimal or no damage can occur. Additional advantages provided by the high-temperature, rapid annealing process can also include reduced fabrication time, and thus increased production throughput. In some embodiments, the annealing can be performed in air on hot plates. In alternative embodiments, the annealing can be performed in a vacuum chamber, or in a chamber filled with a forming gas ($N_2/H_2$), one or more inert gases (e.g., $Ar_2$), or a combination thereof.

As discussed before, high-temperature, rapid annealing can re-crystallize the amorphous TCO, which not only improves transparency but also reduces the resistivity of the TCO material. Consequently, the annealing and the low-temperature PVD of TCO layers can improve overall efficiency of photovoltaic structures by about 1-2%.

In addition to the TCO, the subsequently formed metallic layers (e.g., the metallic seed layer and the ECP Cu layer) can also be annealed. Annealing the Cu grid after the ECP can increase the reliability and reduce resistivity of the grid. In some embodiments, the same high-temperature, rapid annealing process used for annealing of the TCO layer can also anneal the electroplated Cu grid. As a result, both the TCO layers and the Cu grids are annealed at the same time.

Figure 4:
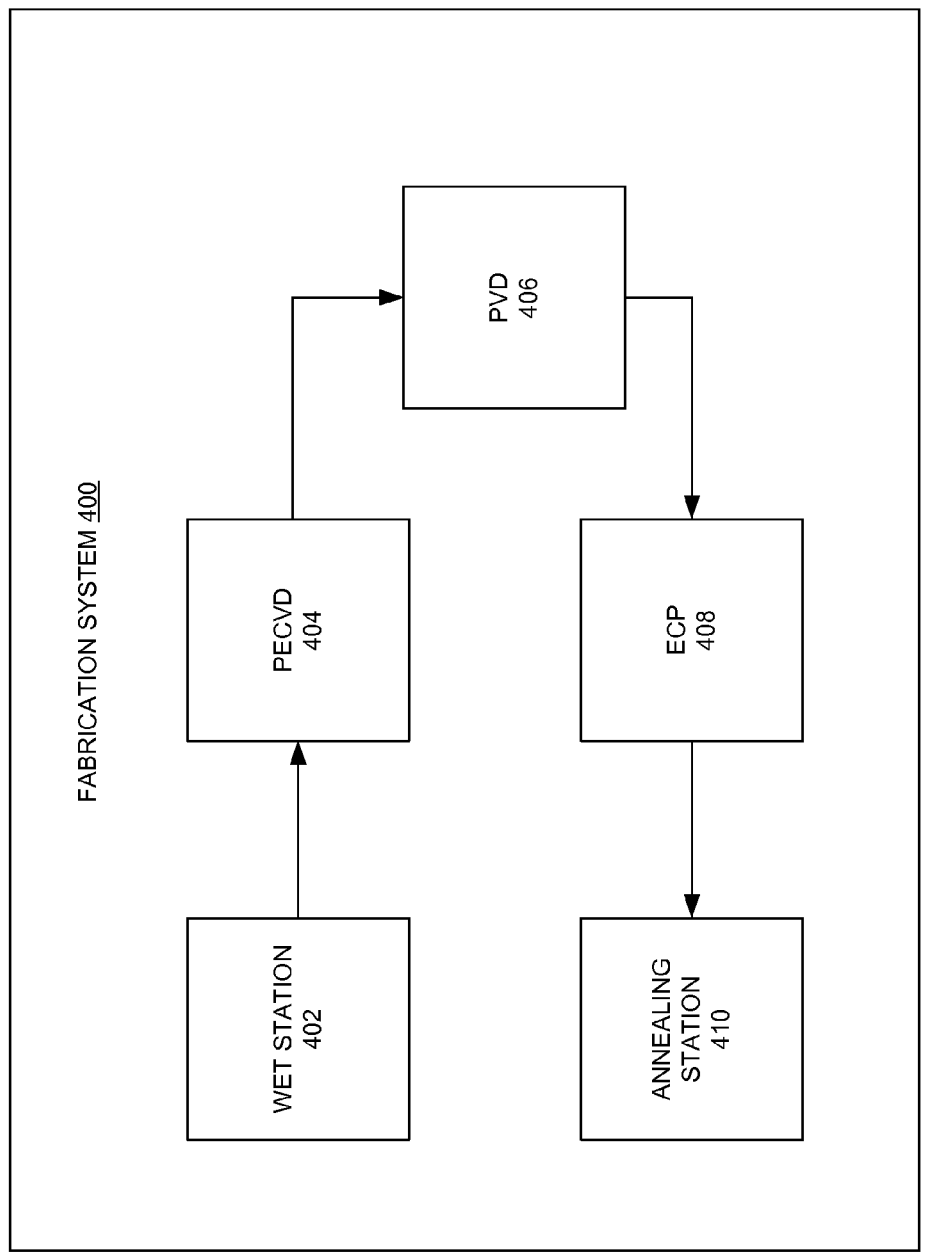
FIG. 4 shows an exemplary fabrication system, according to an embodiment of the present invention.

FIG. 4 shows an exemplary fabrication system, according to an embodiment of the present invention. In FIG. 4, fabrication system 400 can include wet station 402, PECVD tool 404, PVD tool 406, ECP station 408, and annealing station 410. Wet station 402 and PECVD tool 404 can be similar to wet station 202 and PECVD tool 204 shown in FIG. 2, respectively. Both wet station 402 and PECVD tool 404 can process Si substrate in batches, with each batch including tens or hundreds of Si substrates. In some embodiments, wet station 402 can be configured to form the front and back QTB layers simultaneously using a wet oxidation technique on the Si substrates. Multilayer structures emerging from PECVD tool 404 can include an emitter layer on one side and a surface-field layer on the other side.

Figure 5:
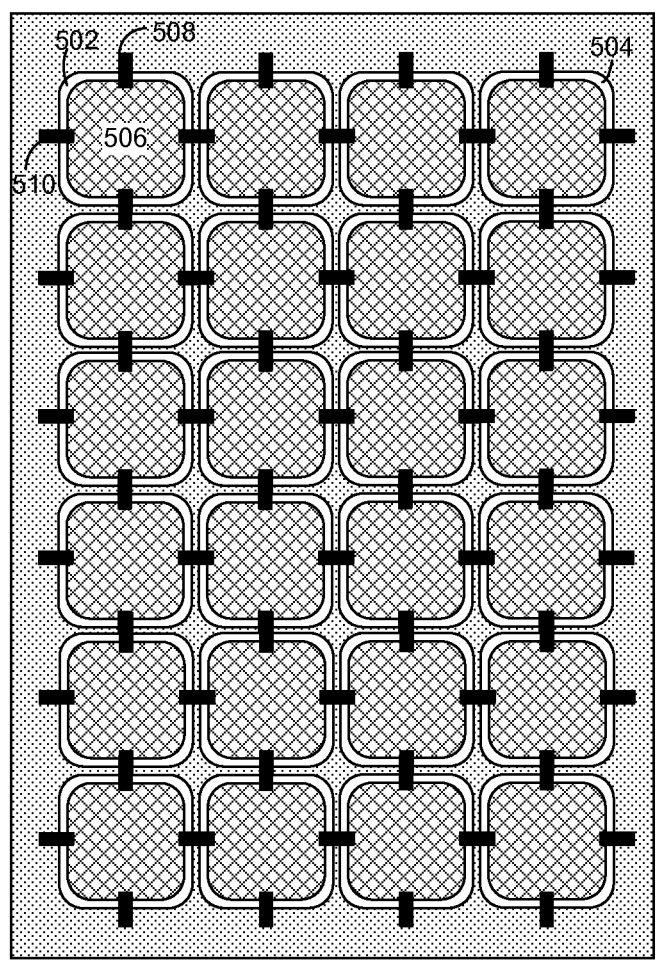
FIG. 5 shows an exemplary substrate holder, according to an embodiment of the present invention.

PVD tool 406 can be configured to sequentially deposit a thin layer of TCO and one or more metallic layers on one or both sides of the multilayer structures. In some embodiments, PVD tool 406 can include a multiple-target sputtering tool (e.g., an RF magnetron sputtering tool). The multiple targets inside the deposition chamber can include an ITO target and one or more metallic targets. In some embodiments, the targets can include rotary targets coupled to periodically tuned capacitors. Because the multiple layers (e.g., a TCO layer and one or more metallic layers) can be deposited sequentially without needing to break the vacuum, the PVD process consumes significantly less time than multiple separate PVD processes. In some embodiments, the substrate holder inside PVD tool 406 can be vertically oriented, as shown in FIG. 5, to expose both sides of the substrate to the sputtered ions to allow simultaneous material deposition. For example, the front and back TCO layers can be simultaneously deposited onto the emitter and surface-field layers, and the front and back metallic seed layers can be simultaneously deposited onto the front and back TCO layers. Alternatively, substrates can be placed in a carrier that is oriented substantially horizontally during deposition. However, this might require that the substrates be turned over to allow deposition on the other side.

FIG. 5 shows an exemplary substrate holder, according to an embodiment of the present invention. In FIG. 5, substrate holder 500 for PVD can include a number of openings (e.g., openings 502 and 504), which can be arranged in an array. Each opening can accommodate a Si-based substrate. For example, opening 502 can accommodate Si-based substrate 506. Depending on the system, the openings can be configured to accommodate Si-based substrates of various sizes and shapes, including but not limited to: 5-inch by 5-inch square, 6-inch by 6-inch square, 5-inch by 5-inch pseudo-square, and 6-inch by 6-inch pseudo-square. Each substrate can be held in place by multiple clips, such as clips 508 and 510. During a PVD process, one or more substrate holders can be placed inside the PVD chamber vertically to allow simultaneous material deposition on both sides of the Si-based substrates. In some embodiments, a thin layer of ITO and a thin layer of Cu can be sequentially deposited on both sides of the Si-based substrates.

Now returning to FIG. 4, ECP station 408 can be similar to ECP station 212 shown in FIG. 2. More specifically, the wafer-holding jigs can carry the photovoltaic structures in such a way that both the front and back sides of the photovoltaic structures are exposed to the electrolyte solution. Therefore, metallic ions (e.g., Cu ions) can be deposited on both sides of the photovoltaic structures as the wafer-holding jigs moving through the electrolyte bath. In other words, the front and back metallic grids can be formed simultaneously. Photovoltaic structures emerging from ECP station 408 can be cleaned, dried, and sent to annealing station 410 for a high-temperature, rapid annealing. Annealing station 410 can take on various forms. In some embodiments, annealing station 410 can include hot plates, which can be placed in air or in a vacuum. In some embodiments, annealing station 410 can include an oven, which can be filled with various ambient gases, such as air, a forming gas, one or more inert gases (e.g., $Ar_2$), or any combinations thereof. The annealing temperature can range from 150° C. to 400° C., and the annealing time can range from a few seconds to a few minutes (e.g., from 5 seconds to 5 minutes). If the annealing temperature is set high, the annealing time can be set relatively short.

Compared with the fabrication system shown in FIG. 2, fabrication system 400 provides a number of advantages. The most obvious advantage is that system 400 can include fewer components than system 200. Novel fabrication system 400 can include a single PVD tool configured to deposit multiple layers of different materials. Fewer tools means lower equipment cost, smaller factory spaces, and hence reduced capital expenditures. In addition, the novel fabrication system can also provide a more streamlined fabrication process. There is no longer a need to unload the photovoltaic structures from one PVD tool and load them into another PVD tool, or to wait for the deposition chambers to be pumped down after the loading/unloading. Consequently, the production time of one batch of photovoltaic structures can be significantly reduced. The batch production time can be further reduced by the shorter time needed for annealing.

This novel fabrication system can also provide additional advantages. More specifically, the low-temperature PVD of the TCO layers can improve the $V_{oc}$ of the fabricated photovoltaic structures, and the high-temperature rapid annealing can improve the TCO film property (e.g., transparency and resistivity) and reliability of the metallic grid. Overall, this novel fabrication system can produce, with high throughput, photovoltaic structures that have a higher $V_{oc}$, higher TCO transparency, lower TCO resistivity, lower grid resistivity, and better grid reliability.

Figure 6:
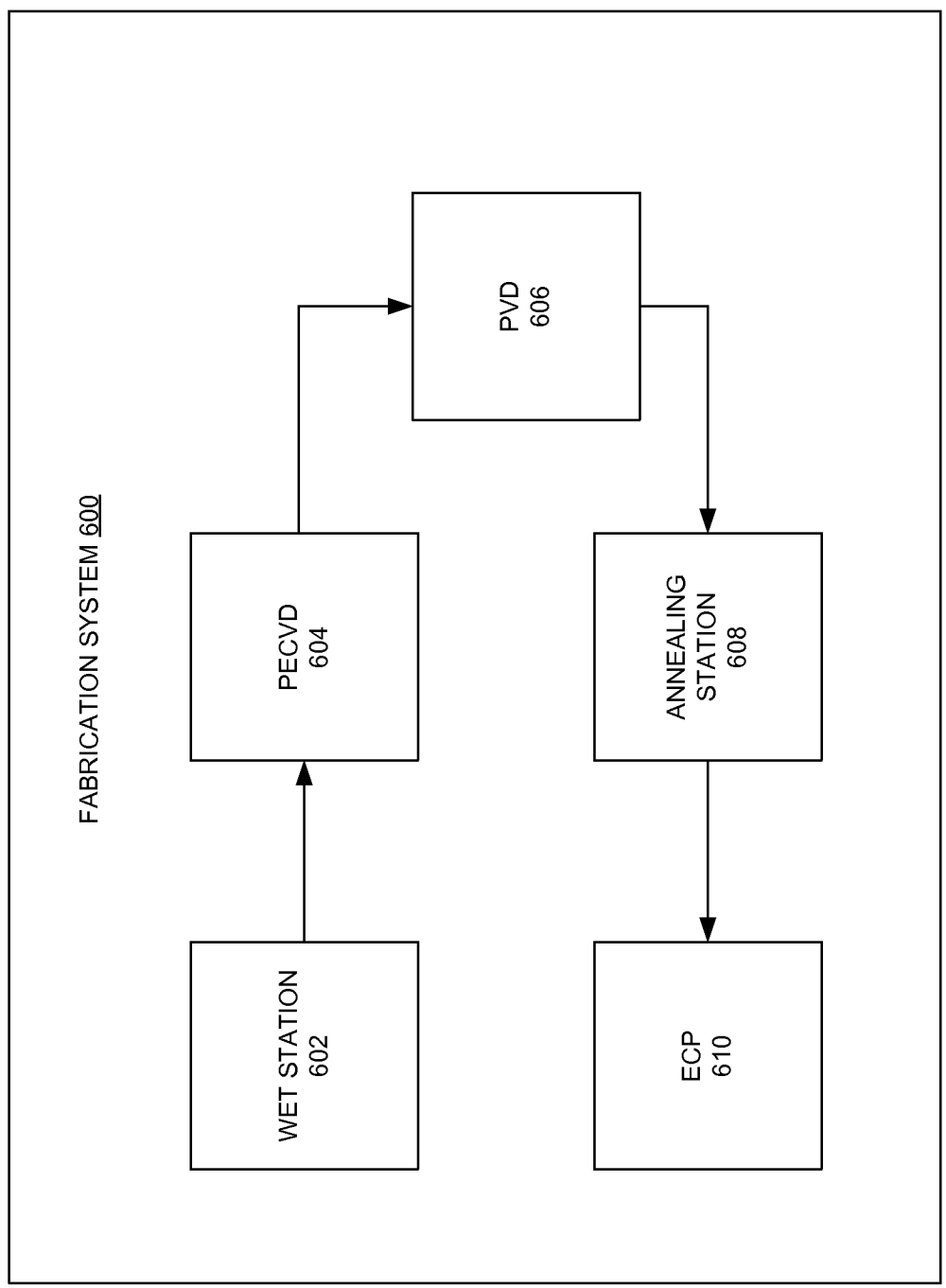
FIG. 6 shows an exemplary fabrication system, according to an embodiment of the present invention

In the example shown in FIGS. 3 and 4, the TCO annealing is performed after the ECP process of the metallic grid. In practice, it is also possible to have the TCO annealed before the ECP process. FIG. 6 shows an exemplary fabrication system, according to an embodiment of the present invention. In FIG. 6, fabrication system 600 can include wet station 602, PECVD tool 604, PVD tool 606, annealing station 608, and ECP station 610. Functions and settings of the various components of fabrication system 600 can be similar to those of fabrication system 400, with the exception of annealing station 608. For example, wet station 602 can be similar to wet station 402, PECVD tool 604 can be similar to PECVD tool 404, PVD tool 606 can be similar to PVD tool 406, and ECP station 610 can be similar to ECP tool 408.

Unlike the annealing station shown in FIG. 4, in FIG. 6, annealing station 608 can be positioned between PVD tool 606 and ECP station 610 to allow photovoltaic structures emerging from PVD tool 606 to be annealed before the ECP process. In some embodiments, after depositions of both the TCO layer and the Cu seed layer, the photovoltaic structures can be sent directly to anneal station 608, which can be a separate tool. In alternative embodiments, annealing station 608 can be incorporated into PVD tool 606 to allow in-situ annealing. The annealing process can be performed at a lower temperature and for a longer duration due to the absence of the Cu grid at the moment.

Allowing in-situ annealing of the TCO layer can simplify the fabrication system because a separate annealing tool may no longer be needed. A simplified system can lead to reduced cost. However, annealing the TCO prior to the formation of the Cu grids also means that the Cu grids will not be annealed by the same process. Additional annealing may be needed in order to anneal the Cu grids.

In general, embodiments of the present can invention provide a solution to a technical problem that is unique to photovoltaic structures with electroplated metallic grids. More specifically, the relative weak bonding between the electroplated metallic grid and the underlying TCO layer may require a metallic seed layer be deposited on the TCO layer using a PVD technique. This additional PVD operation can reduce the fabrication throughput. However, by allowing the TCO layer and metallic seed layer to be deposited in the same PVD chamber and by using a high temperature, rapid post-PVD annealing process, embodiments of the present invention can not only improve the optical and electrical properties of the TCO layer but also increase the fabrication throughput. The annealing of the TCO layer can be performed before or after the electroplating of the metallic grids.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for fabricating a photovoltaic structure, the method comprising:
obtaining a Si substrate;
forming an emitter layer on a first surface of the Si substrate;
depositing, using a physical vapor deposition machine, a transparent conductive oxide layer on the emitter layer;
depositing, without removing the Si substrate from the physical vapor deposition machine and without first annealing the deposited transparent conductive oxide layer, a metallic layer on the transparent conductive oxide layer; and
annealing the transparent conductive oxide layer after depositing the metallic layer.

2. The method of claim 1, further comprising:
before the annealing, depositing, using a plating technique, a metallic grid on the metallic layer, and wherein the annealing process simultaneously anneals the transparent conductive oxide layer and the plated metallic grid.

3. The method of claim 1, further comprising:
forming a surface-field layer on a second surface of the Si substrate;
depositing, using the physical vapor deposition machine, a second transparent conductive oxide layer on the surface-field layer;
depositing, without removing the substrate from the physical vapor deposition machine, a second metallic layer on the second transparent conductive oxide layer; and
depositing, using a plating technique, a second metallic grid on the second metallic seed layer.

4. The method of claim 1, wherein depositing the transparent conductive oxide layer or the metallic layer comprises sputtering, evaporation, or both.

5. The method of claim 1, wherein the metallic layer includes: Cu, Ni, Ag, Ti, Ta, W, TiN, TaN, WN, TiW, NiCr, or any combination thereof.

6. The method of claim 1, wherein the transparent conductive oxide layer includes: indium-tin-oxide (ITO), aluminum-doped zinc-oxide (ZnO:Al), gallium-doped zinc-oxide (ZnO:Ga), tungsten-doped indium oxide (IWO), Zn—In—Sn—O (ZITO), or any combination thereof.

7. The method of claim 1, wherein depositing the transparent conductive oxide layer is performed at a temperature lower than 100° C.

8. The method of claim 1, wherein annealing the transparent conductive oxide layer involves subjecting the photovoltaic structure to a temperature ranging from 150° C. to 400° C.

9. The method of claim 8, wherein annealing the transparent conductive oxide layer comprises subjecting the photovoltaic structure to the temperature for a time period ranging from 5 seconds to 5 minutes.

10. The method of claim 8, wherein the annealing is performed in:
air;
vacuum;
forming gas; or
inert gases.

11. A system for fabrication of a photovoltaic structure, the system comprising:
a physical vapor deposition tool configured to sequentially deposit a transparent conductive oxide layer and a metallic layer on an emitter layer formed on a first surface of a Si substrate, without requiring the Si substrate to be removed from the physical vapor deposition tool after depositing the transparent conductive oxide layer and without first annealing the deposited transparent conductive oxide layer;
an electroplating tool configured to plate a metallic grid on the metallic layer; and
a thermal annealing tool configured to anneal the transparent conductive oxide layer.

12. The system of claim 11, wherein the electroplating tool is configured to plate a metallic grid before the thermal annealing tool annealing the transparent conductive oxide layer, and wherein the thermal annealing tool is configured to simultaneously anneal the plated metallic grid and the transparent conductive oxide layer.

13. The system of claim 11,
wherein the physical vapor deposition tool is further configured to sequentially deposit a second transparent conductive oxide layer and a second metallic layer on a surface-field layer formed on a second surface of the Si substrate, without requiring the Si substrate to be removed from the physical vapor deposition tool after depositing the second transparent conductive oxide layer; and
wherein the electroplating tool is further configured to deposit a second metallic grid on the second metallic seed layer.

14. The system of claim 11, wherein the physical vapor deposition tool is configured to perform sputtering, evaporation, or both.

15. The system of claim 11, wherein the metallic layer includes: Cu, Ni, Ag, Ti, Ta, W, TiN, TaN, WN, TiW, NiCr, or any combination thereof.

16. The system of claim 11, wherein the transparent conductive oxide layer includes: indium-tin-oxide (ITO), aluminum-doped zinc-oxide (ZnO:Al), gallium-doped zinc-oxide (ZnO:Ga), tungsten-doped indium oxide (IWO), Zn—in—Sn—O (ZITO), or any combination thereof.

17. The system of claim 11, wherein the thermal annealing tool is configured to subject the photovoltaic structure to a temperature ranging from 150° C. to 400° C.

18. The system of claim 17, wherein the thermal annealing tool is configured to subject the photovoltaic structure to the temperature for a time period ranging from 5 seconds to 5 minutes.

19. The system of claim 18, wherein the thermal annealing tool is configured to anneal the transparent conductive oxide layer in:
air;
vacuum;
forming gas; or
inert gases.

20. The system of claim 18, wherein the physical vapor deposition tool is configured to deposit the transparent conductive oxide layer at a temperature lower than 100° C.

* * * * *